(12) United States Patent
Itai

(10) Patent No.: US 8,030,845 B2
(45) Date of Patent: Oct. 4, 2011

(54) ORGANIC ELECTROLUMINESCENCE DEVICE AND METHOD FOR MANUFACTURING THE SAME

(75) Inventor: Yuichiro Itai, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 910 days.

(21) Appl. No.: 11/896,429

(22) Filed: Aug. 31, 2007

(65) Prior Publication Data

US 2008/0074042 A1 Mar. 27, 2008

(30) Foreign Application Priority Data

Sep. 26, 2006 (JP) .................. 2006-261190

(51) Int. Cl.
*H01L 51/50* (2006.01)
*H01L 51/52* (2006.01)
*H01L 51/56* (2006.01)

(52) U.S. Cl. ............ 313/512; 445/25; 445/24; 313/511; 313/509

(58) Field of Classification Search .......... 313/500–512; 445/24, 25
See application file for complete search history.

(56) References Cited

U.S. PATENT DOCUMENTS

| 6,589,675 | B2 * | 7/2003 | Peng ............................. | 313/512 |
| 2001/0013756 | A1 * | 8/2001 | Mori et al. ..................... | 313/512 |
| 2005/0116637 | A1 | 6/2005 | Yoshizawa | |

FOREIGN PATENT DOCUMENTS

| JP | 2001-126868 A | | 5/2001 |
| JP | 2001319776 A | * | 11/2001 |
| JP | 2004-47381 A | | 2/2004 |
| JP | 2005-123012 A | | 5/2005 |
| JP | 2005-135648 A | | 5/2005 |

OTHER PUBLICATIONS

Japanese Notice of Reasons for Rejection dated Feb. 1, 2011 for Japanese Application No. 2006-261190.

* cited by examiner

*Primary Examiner* — Mariceli Santiago
(74) *Attorney, Agent, or Firm* — Birch, Stewart, Kolasch & Birch, LLP

(57) ABSTRACT

The invention provides a method for manufacturing an organic electroluminescence device having a first flexible plate and a second flexible plate and an organic electroluminescence element provided on a portion at approximately the center of at least one of the flexible plates. The method includes: forming the first flexible plate having a S region which has larger UV light transmittance and a W region which has larger UV light transmittance; forming a substantially frame-shaped UV-curable resin layer on the first flexible plate and/or the second flexible plate so that the UV-curable resin layer overlaps at least partially with the S region; and adhering the first flexible plate with the second flexible plate by irradiation of UV light which uses the S region as an irradiation face so as to cure the UV-curable resin layer. The invention further provides an organic electroluminescence device formed by the method.

15 Claims, 15 Drawing Sheets

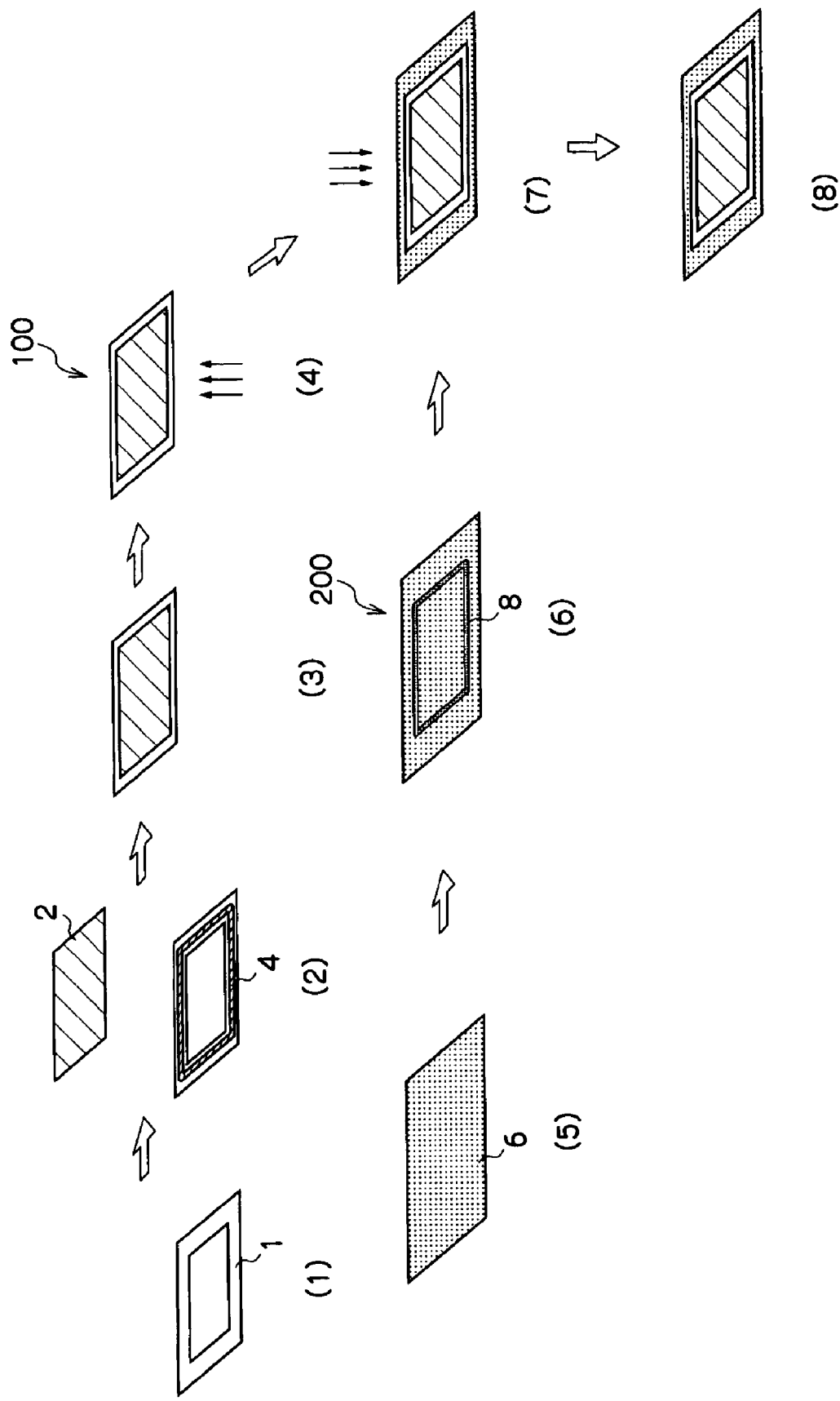

ORGANIC ELECTROLUMINESCENCE DEVICE AND METHOD FOR MANUFACTURING THE SAME

CROSS-REFERENCE TO RELATED APPLICATION

This application claims priority under 35 USC 119 from Japanese Patent Application No. 2006-261190, the disclosure of which is incorporated by reference herein.

BACKGROUND OF THE INVENTION

1. Field of the Invention

The present invention relates to an organic electroluminescence device capable of luminescence by converting electrical energy into light and a method for manufacturing the same.

2. Description of the Related Art

Nowadays, research and development on various display elements is being actively conducted, and particularly since organic electroluminescence (EL) elements can produce high-intensity luminescence at a low voltage they are thus drawing attention as promising display elements.

Such organic electroluminescence elements, when exposed to the air, deteriorate in luminescence properties due to water, gas etc., and thus use a sealing plate for sealing the element to prevent such deterioration.

Meanwhile, a flexible organic electroluminescence element using a resin substrate in place of a glass substrate as a substrate for the element is disclosed (see, for example, Japanese Patent Application Laid-Open (JP-A) No. 2004-47381 and JP-A No. 2005-123012).

However, when a UV-curable resin that generates less gas and heat adversely influencing an organic electroluminescence element is used as an adhesive between a sealing plate and a resin substrate when producing a sealing plate, adhesiveness of the UV-curable resin which was not problematic in conventional methods using a glass substrate of high UV light transmittance has emerged as a new problem.

SUMMARY OF THE INVENTION

Under the circumstances described above, the present invention provides a method for manufacturing an organic EL device, which is excellent in sealing properties and exerts less influence on luminescence property. The invention also provides an organic EL device produced by the manufacturing method.

Namely, as a first embodiment, the invention provides a method for manufacturing an organic electroluminescence device comprising a first flexible plate and a second flexible plate and an organic EL element provided on a portion at approximately the center of at least one of the flexible plates, the method comprising:

(A) forming the first flexible plate;

(B) forming a substantially frame-shaped UV-curable resin layer on at least one of the first flexible plate and the second flexible plate; and (C) adhering the first flexible plate with the second flexible plate, wherein, in the (A) forming the first flexible plate, the first flexible plate has a S region and a W region which are different from each other in the quantity of UV light transmitted per unit area therethrough, the W region is present in a portion approximately at the center of the first flexible plate, the S region is present at a periphery of the W region, and the quantity of UV light transmitted through the S region is larger per unit area than the quantity of UV light transmitted through the W region;

in the (B) forming the substantially frame-shaped UV-curable resin layer on at least one of the first flexible plate and the second flexible plate, when the first flexible plate and the second flexible plate have been overlapped with each other, the UV-curable resin layer is positioned at a periphery of the organic EL element and overlaps at least partially with the S region; and in the (C) adhering the first flexible plate with the second flexible plate, after the S region and the frame-shaped UV-curable resin layer are faced to each other so as to be overlapped, the resultant is irradiated with UV light which uses the S region as an irradiation face, so as to cure the UV-curable resin layer.

In one aspect of the first embodiment, the method for manufacturing an organic electroluminescence device is characterized in that the (A) forming the first flexible plate comprises adhering a first polymer film, which is substantially frame-shaped, and a second polymer film, which has a gas barrier film formed thereon, so that the first polymer film and the second polymer film face each other such that the second polymer film covers substantially all of the area of the inside of the frame of the first polymer film and at least a part, which corresponds to the S region, of the first polymer film is left protruding from the outer periphery of the second polymer film, so as to form the first flexible plate.

In another aspect of the first embodiment, the method for manufacturing an organic electroluminescence device is characterized in that the gas barrier film does not reside in the S region or the thickness of the gas barrier film in the S region is less than the thickness of the gas barrier film in the W region.

In another aspect of the first embodiment, the method for manufacturing an organic electroluminescence device is characterized by further comprising forming the S and W regions so that the thickness of the S region is less than the thickness of the W region so as to differentiate the S and W regions in the quantity of UV light transmitted per unit area therethrough.

In another aspect of the first embodiment, the method for manufacturing an organic electroluminescence device is characterized in that a material used for forming the gas barrier film in the S region has a higher UV transmittance than that of a material used for forming the gas barrier film used in the W region.

The method for manufacturing an organic electroluminescence device of any one of the above aspects of the first embodiment may be characterized in that the gas barrier film material comprises at least SiN, SiON, SiOx, MgO, $Al_2O_3$, or an organic resin, in which x represents the content ratio of the number of oxygen atoms relative to the number of silicon atoms and is larger than 0.

Further, as a second embodiment, the invention provides an organic electroluminescence device produced by any one of the preceding methods of the first embodiment of the present invention.

BRIEF DESCRIPTION OF THE DRAWINGS

FIG. 1 is a manufacturing flow showing one exemplary embodiment of the method for manufacturing the organic electroluminescence device of the invention.

FIG. 5B shows an exemplary embodiment which is similar to that in FIG. 4 except that the configuration of the first flexible plate is partially modified.

FIG. 13A shows an exemplary embodiment which is similar to that shown in FIG. 6A except that a polymer film is further laminated in the outer side of the gas barrier film of the first flexible plate. FIG. 13B shows an exemplary embodiment which is similar to the organic electroluminescence device shown in FIG. 6 except that a plurality of the first flexible plates are laminated in the device

DETAILED DESCRIPTION OF THE INVENTION

Hereinafter, the organic electroluminescence device of the present invention and the method for manufacturing the same are described in detail.

First, the configuration of the organic electroluminescence device of the invention is described.

Figure 2A:
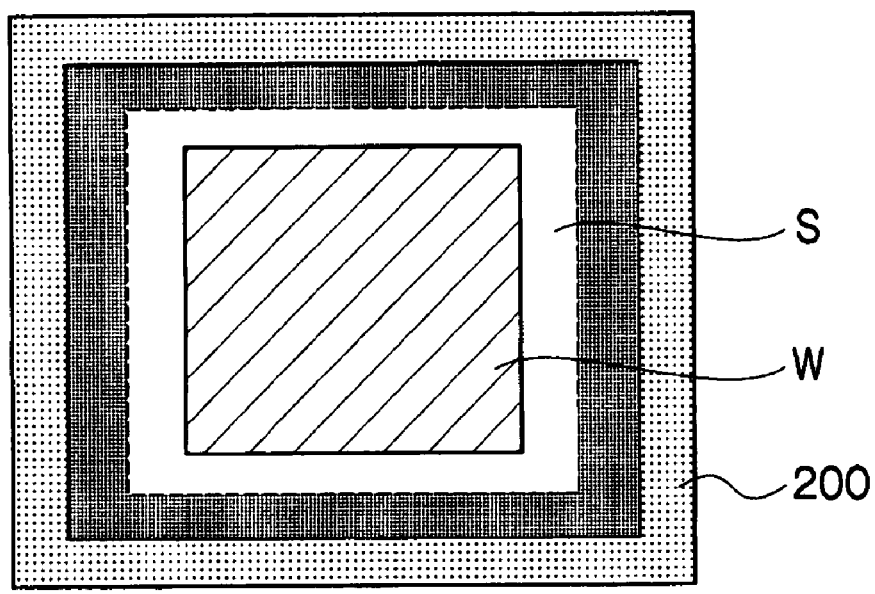
FIGS. 2A and 2B are conceptual diagrams showing the configuration of an organic EL device of the invention.
Figure 2B:
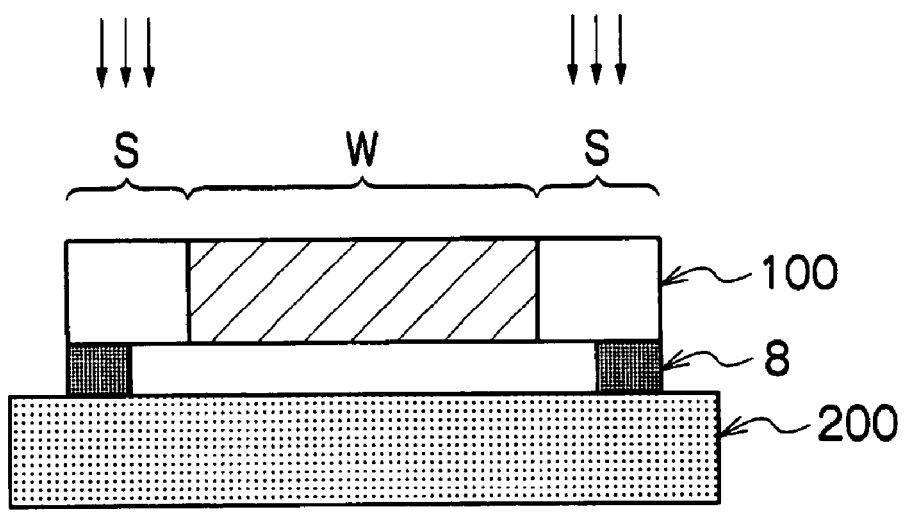

FIGS. 2A and 2B are conceptual diagrams showing the configuration of an organic EL device of the invention.

As shown in FIGS. 2A and 2B, the organic EL device of the invention is configured such that it has a substantially frame-shaped UV-curable resin layer 8 (UV-curable adhesive layer) on a second flexible plate 200, has on the UV-curable resin layer a first flexible plate 100 having a region through which a large quantity of UV light is transmitted per unit area (hereinafter referred as an "S region") and a region through which a small quantity of UV light is transmitted per unit area (hereinafter referred as "W region") different from each other in the quantity of UV light transmitted per unit area therethrough, and further has, on at least one of the flexible plates, an organic electroluminescence element (not shown) between the first flexible plate 100 and the second flexible plate 200. A part of the W region may also be present outside the S region.

By way of example, one aspect of the method for manufacturing the organic electroluminescence device of the invention is specifically described below by reference to the respective steps in FIG. 1. FIG. 1 is a manufacturing flow showing one exemplary embodiment of the method for manufacturing the organic electroluminescence device of the invention.

(A) Forming First Flexible Plate Having S and W Regions Different from Each Other in Quantity of UV Light Transmitted Therethrough Process for Forming the First Flexible Plate: Stages (1) to (4)

As shown in stages (1) and (2) in FIG. 1, a first polymer film 1 provided with a frame-shaped adhesive (UV-curable adhesive) 4 was pressure-bonded to a second polymer film 2 provided with a gas barrier film.

At this time, a substantially all area inside the frame of the first polymer film was covered with the second polymer film 2, while at least a part of the first polymer film 1 was left as the S region (through which a large quantity of UV light is transmitted) protruding from the outer periphery of the second polymer film 2 provided with a gas barrier film.

The second polymer film 2 provided with a gas barrier film has the gas barrier film on at least one side.

Next, the UV-curable adhesive 4 was cured by irradiation with UV light to form a first flexible plate 100 having a W region (a region through which UV light hardly passes, that is, "a region through which a small quantity of UV light per unit area is transmitted") and an S region (a region through which UV light per unit area easily passes, that is, "a region through which a large quantity of UV light per unit area is transmitted") resides protruding from the periphery of the W region.

Process for Forming a Second Flexible Plate: Stages (5) to (6)

Separately, a second flexible plate 200 having a frame-shaped UV-curable resin layer 8 was formed by applying a UV-curable resin adhesive onto a third polymer film 6 provided with a gas barrier film.

The position of the third polymer film 6 onto which the UV-curable resin adhesive is applied should be a position which is at a periphery of an organic EL element (not shown) formed approximately in the center portion, on one side, of the third polymer film 6 and should be a position which overlaps at least partially with the S region formed on the first flexible plate 100. By doing so, the UV-curable resin adhesive can be cured by irradiation with UV light in a later process.

The third polymer film 6 provided with a gas barrier film has the gas barrier film on at least one side.

Process for Bonding the First Flexible Plate with the Adhesive to the Second Flexible Plate: Steps (7) to (8)

The S region of the first flexible plate 100 obtained above and the frame-shaped UV-curable resin layer 8 of the second flexible plate 200 were made to face each other and then pressure-bonded to each other such that the UV-curable resin adhesive 8 overlapped at least partially with the S region formed on the first flexible plate, and as shown in FIG. 1 (7), the S region was then irradiated as an irradiation face with UV light applied at the side of the first flexible plate, whereby the UV-curable resin layer 8 was cured.

The UV-curable resin layer 8 was cured with UV light thereby bonding the first flexible plate 100 with the adhesive to the second flexible plate 200, whereby an organic electroluminescence device was produced.

The quantity of UV light transmitted is expressed in units of mJ/cm$^2$, and UV light transmitted through an ultraviolet intensity meter (trade name: UIT-150, Ushio, Inc.) was measured by irradiating the UV light to a sensor of the ultraviolet intensity meter.

Next, each exemplary embodiment of the organic electroluminescence device of the invention will be described by reference to FIGS. 3 to 16. FIGS. 3 to 7 each show an exemplary embodiment in which the first flexible plate serves as a sealing plate, and the second flexible plate serves as a substrate. FIGS. 8 to 12 each show an exemplary embodiment in which the first flexible plate 100 serves as a substrate, and the second flexible plate 200 serves as a sealing plate. That is, the S region through which a large quantity of UV light per unit area is transmitted is positioned inside the periphery of the first flexible plate irradiated with UV light and outside an organic electroluminescence element.

Figure 3A:
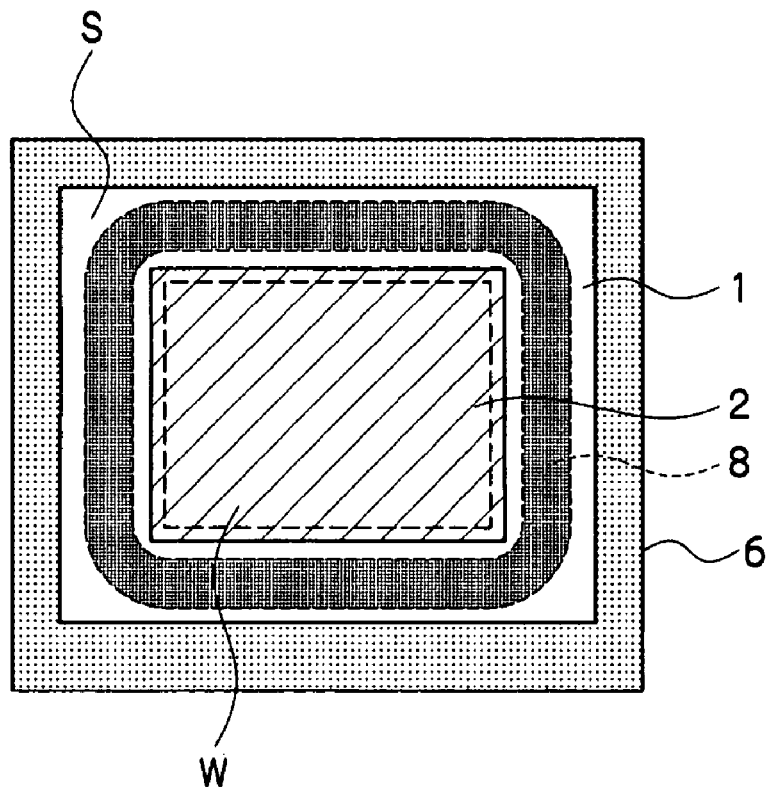
FIG. 3A is a plan view showing one embodiment of the organic electroluminescence device of the invention.
Figure 3B:
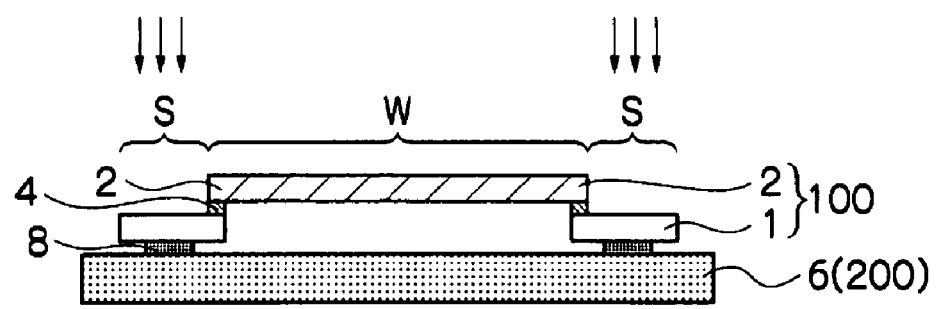
FIG. 3B is a cross-sectional view of the organic electroluminescence device in FIG. 3A.

FIG. 3A is a plan view showing one embodiment of the organic electroluminescence device of the invention obtained by the method for manufacturing the organic electroluminescence device of the invention shown in FIG. 1, and FIG. 3B is a cross-sectional view of the organic electroluminescence device in FIG. 3A.

The organic electroluminescence device shown in FIG. 3B is composed of a second flexible plate 200, a first flexible plate 100 opposite thereto, and a UV-curable resin layer 8 between the second flexible plate 200 and the first flexible plate 100.

The second flexible plate 200 is composed of a polymer film having a gas barrier film formed thereon (also referred to as "third polymer film" or "third polymer film provided with a gas barrier film").

By using the third polymer film 6 provided with a gas barrier film, permeable substances such as gas, water etc. can be prevented from entering the device, and the deterioration of an organic electroluminescence element (not shown) therein can be prevented.

From the viewpoint of light transmittance and prevention of the permeation by gas, water etc., the material of the gas barrier film in the third polymer film is preferably at least of SiN, SiON, SiO$_x$, SiAlO, MgO, Al$_2$O$_3$ or organic resins, and is more preferably SiON or SiN. In the inorganic materials, x represents the content ratio of the number of oxygen atoms relative to the number of silicon atoms. x is larger than 0. x is preferably in a range of 1 to 2, and is more preferably in a range of 1.5 to 1.8. Throughout the specification, x has the same meaning as defined above.

The organic resin is preferably a polyamide resin, an epoxy resin or a polyacrylate resin, and is more preferably a polyacrylate resin.

The gas barrier film can be formed by known film-forming processes such as wet process (such as spin coating) or dry process (such as vacuum deposition or sputtering).

From the viewpoint of light transmittance and prevention of the invasion by gas, water etc., the thickness of the gas barrier film is preferably in a range of 10 nm to 10 µm, and is more preferably in a range of 1 µm to 5 µm.

The material of the polymer film in the third polymer film provided with a gas barrier film is not particularly limited, and examples thereof include polyethylene terephthalate, polymarbonate, polypropylene, polyolefin, polycarbonate, polyethylene naphthalate, polyether sulfone and the like, among which polyethylene naphthalate and polyether sulfone are preferable from the viewpoint of heat resistance.

From the viewpoint of physical characteristics and processing suitability, the thickness of the polymer film in the third polymer film having a gas barrier film formed thereon is preferably in a range of 10 µm to 1,000 µm, is more preferably in a range of 50 µm to 500 µm, and is still more preferably in a range of 100 µm to 300 µm.

The first flexible plate is configured by adhering the first polymer film 1, which is frame-shaped, and the polymer film 2 having a gas barrier film formed thereon (the second polymer film, the second polymer film provided with a gas barrier film), so that the first polymer film 1 and the polymer film 2 face each other such that the polymer film 2 covers an area within the frame of the first polymer film 1 and at least a part (S region) of the first polymer film 1 is left at the periphery of the second polymer film 2. That is, the S region is composed of the first polymer film.

In this configuration, a material of high ultraviolet transmittance can be used as the material of the first polymer film. The quantity of UV light transmitted through the W region can be thus reduced and the quantity of UV light transmitted through the S region can be thus relatively increased. Accordingly, the UV-curable resin layer 8 can be cured effectively with a smaller quantity of UV light. As a result, the deterioration of the organic electroluminescence element by UV light can be effectively prevented.

Examples of the material used in the gas barrier film in the second polymer film include similar ones of those used in the gas barrier film in the third polymer film.

Details of production of the gas barrier film are similar to those described for the third polymer film.

From the viewpoint of light transmittance and prevention of the invasion by gas, water etc., the thickness of the gas barrier film is preferably in a range of 10 nm to 10 µm, and is more preferably in a range of 1 µm to 5 µm.

The material of the frame-shaped polymer film 1 (first polymer film) is preferably a material having higher ultraviolet transmittance because a material of higher ultraviolet transmittance may enable the UV-curable resin adhesive layer 8 to be irradiated with a larger quantity of UV light.

Preferable examples of such a material of the polymer film (first polymer film) include polyethylene terephthalate, polymarbonate, polypropylene, polyolefin, polycarbonate, polyethylene naphthalate and polyether sulfone, and more preferable examples thereof include polyethylene terephthalate, polyethylene naphthalate and polyether sulfone, and still more preferable examples thereof is polyethylene naphthalate.

From the viewpoint of physical characteristics and processing suitability, the thickness of the first polymer film is preferably in a range of 10 µm to 1,000 µm, is more preferably in a range of 50 µm to 500 µm, and still more preferably in a range of 100 µm to 300 µm.

Examples of the material of the polymer film in the second polymer film can be similar ones of those used in the third polymer film, and preferable examples thereof are also similar to those used in the third polymer film.

The range of the thickness of the polymer film in the second polymer film is similar to that of the thickness of the polymer film of the third polymer film, and its preferable range is also similar to that of the polymer film of in the third polymer film.

The UV-curable resin layer 8 is formed in a frame shape on the first flexible plate 100 or the second flexible plate 200 such that when the first and second flexible plates 100 and 200 are made to overlap with each other, the UV-curable resin layer 8 is positioned in a periphery of the organic EL element (not shown) and overlaps at least partially with the S region.

The organic electroluminescence element may be formed on which ever is desired of the first and second flexible plates 100 and 200, and there are no particular limitations to the organic electroluminescence element.

The "frame shape" is not particularly limited insofar as the periphery of a space formed by the first and second flexible plates can be enclosed at the periphery with the UV-curable resin to be cured, thereby achieving the object of preventing gas, water, etc. from entering the space from outside.

Conventionally known UV-curable resins can be used as the material of the UV-curable resin layer 8.

The UV-curable resin layer 8 can be formed from the resin by a wet process (for example, dipping, spin coating, or droplet discharge with a dispenser, of a resin solution in a solvent), a dry process (for example, printing) or the like which are known in the art.

The thickness of the UV-curable resin layer 8 is not particularly limited, while it is preferably of such a thickness as to enable the organic electroluminescence element to be safely enclosed in the device.

Figure 4A:
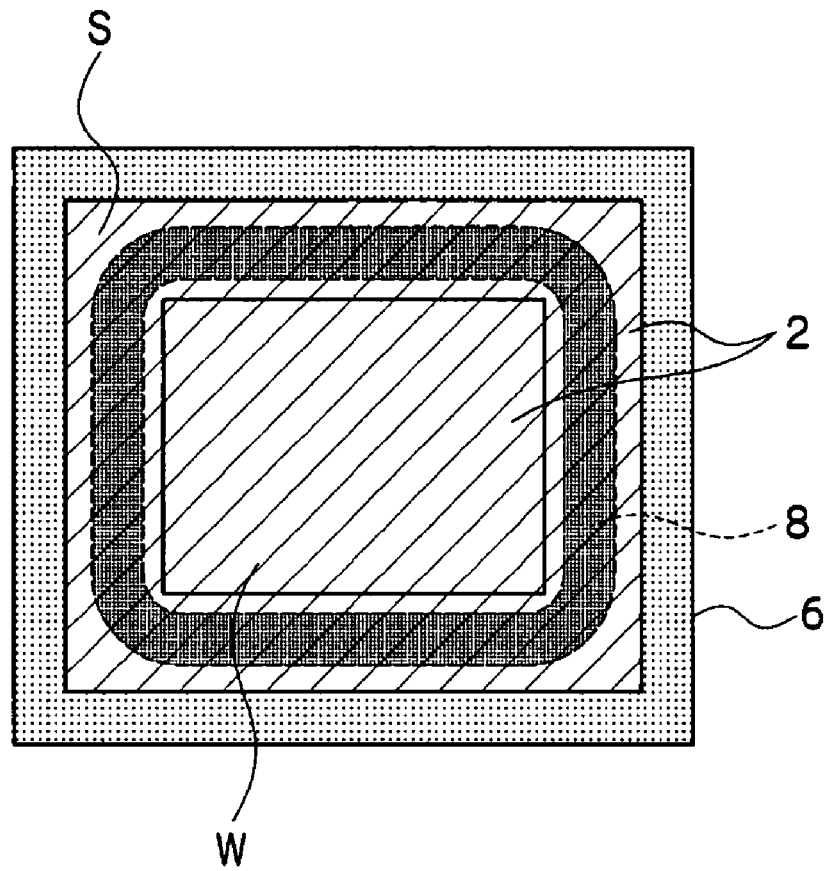
FIG. 4A is a plan view showing another embodiment of the organic electroluminescence device of the invention.
Figure 4B:
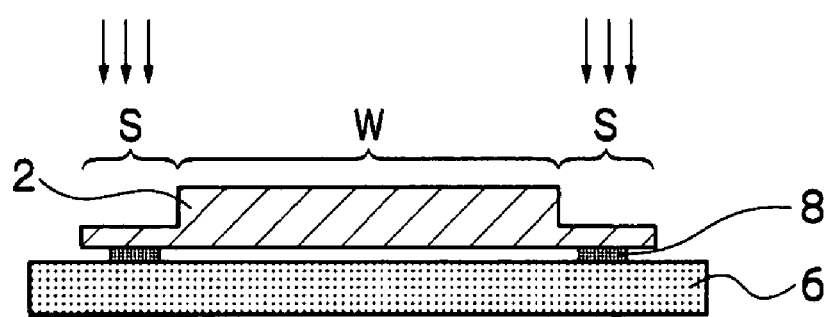
FIG. 4B is a cross-sectional view of the organic electroluminescence device in FIG. 4A.

FIG. 4A is a plan view showing still another embodiment of the organic electroluminescence device of the invention, and FIG. 4B is a cross-sectional view of the organic electroluminescence device in FIG. 4A.

The organic electroluminescence device shown in FIG. 4B is an exemplary embodiment which is similar to that in FIG. 3 except for the configuration of the first flexible plate. That is, as shown in FIG. 4B, the organic electroluminescence device is configured by reducing the thickness of the second polymer film 2 provided with a gas barrier film in the S region which resides at the periphery of the W region, relative to the thickness of the W region.

By reducing the thickness of the area (S region) at the periphery of the second polymer film 2, the quantity of UV light transmitted per unit area through the S region can be made larger than the quantity of UV light transmitted per unit area through the W region even if a uniform quantity of UV light is applied to the polymer film of the same material. As a result, the organic electroluminescence element which is present inside the first flexible plate and the second flexible plate, and when viewed from the side of the first flexible plate is positioned in the backside thereof, is not irradiated with UV light, thus preventing deterioration of the element.

The thickness of the thinner portion (corresponding to the S region) of the second polymer film 2 varies depending on the material used, etc., while it is preferably in a range of ½ to 1/100 relative to the thicker portion, and is more preferably in a range of 1/10 to 1/50 relative to the thicker portion.

The materials of the gas barrier film and the polymer film in the second polymer film 2 are similar to those used in the exemplary embodiment in FIG. 3, and preferable examples of the materials are similar to those used in the exemplary embodiment in FIG. 3.

Figure 5A:
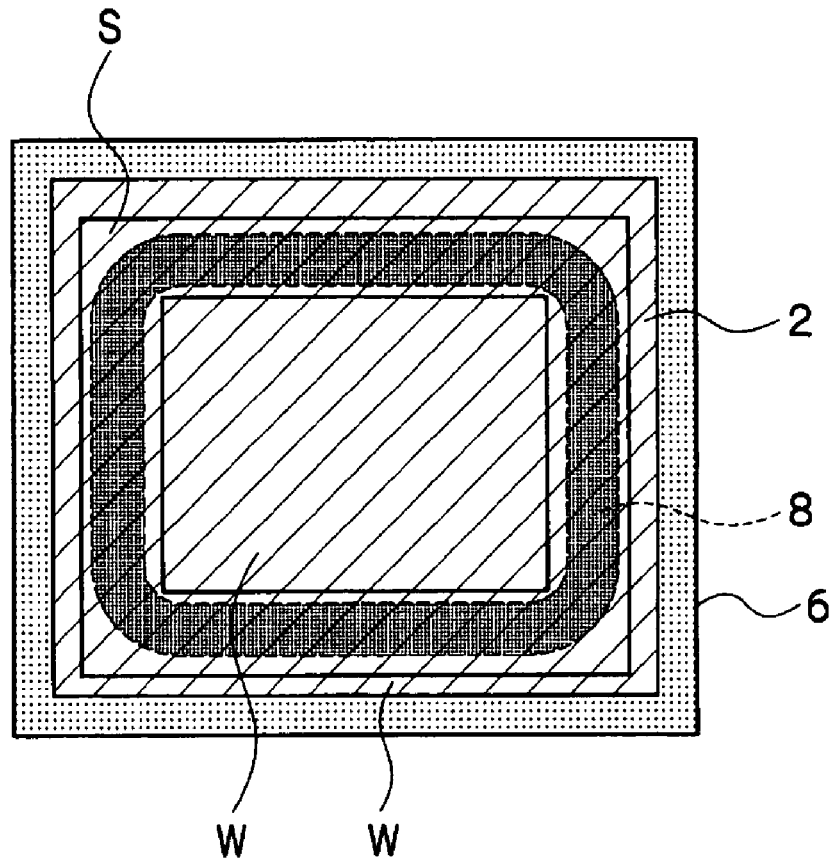
FIG. 5A is a plan view showing still another embodiment of the organic electroluminescence device of the invention.
Figure 5B:
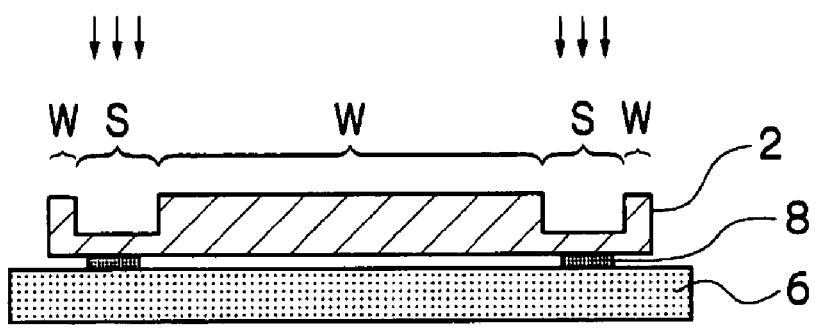
FIG. 5B is a cross-sectional view of the organic electroluminescence device in FIG. 5A.

The organic electroluminescence device shown in FIG. 5B is an exemplary embodiment which is similar to that in FIG. 4 except that the configuration of the first flexible plate is partially modified. That is, the organic electroluminescence device shown in FIG. 5B is configured such that the S region (thin portion) of the second polymer film shown in FIG. 5B is formed at a peripheral edge portion with a portion at the outer periphery thereto (a portion which is left thick as it is) as the W region, and the side of the first flexible plate opposite to its side adjacent to the UV-curable resin layer is irradiated with UV light. The organic electroluminescence device shown in FIG. 5B is the same as in FIG. 4 except for this configuration, and the material constituting the first flexible plate of the organic electroluminescence device in FIG. 5B is also the same as in FIG. 4.

Figure 6A:
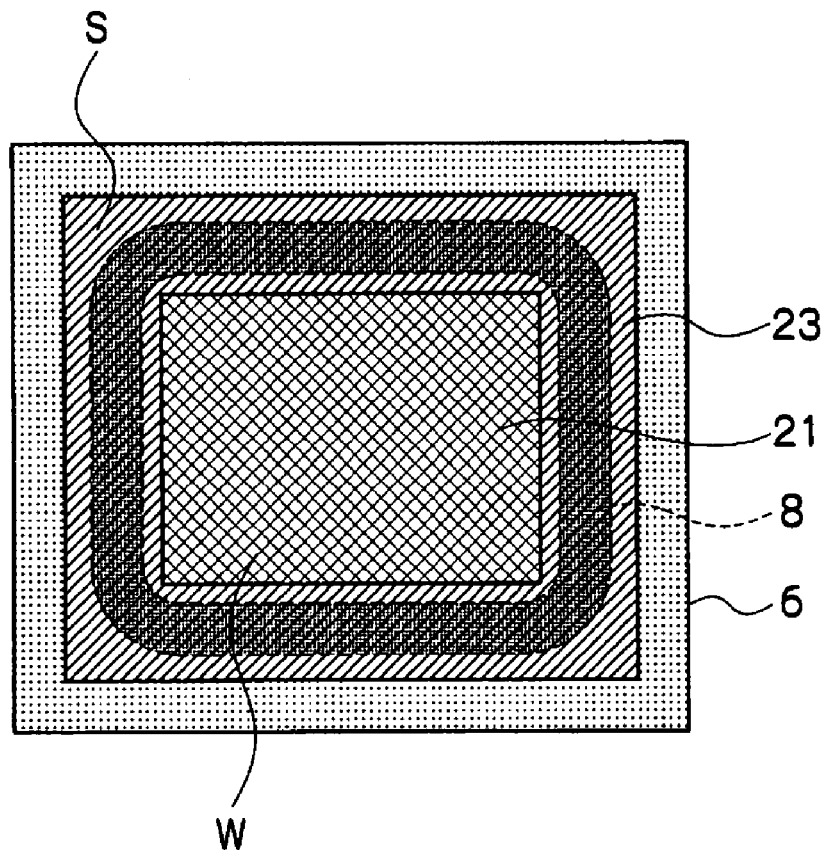
FIG. 6A is a plan view showing still another embodiment of the organic electroluminescence device of the invention.
Figure 6B:
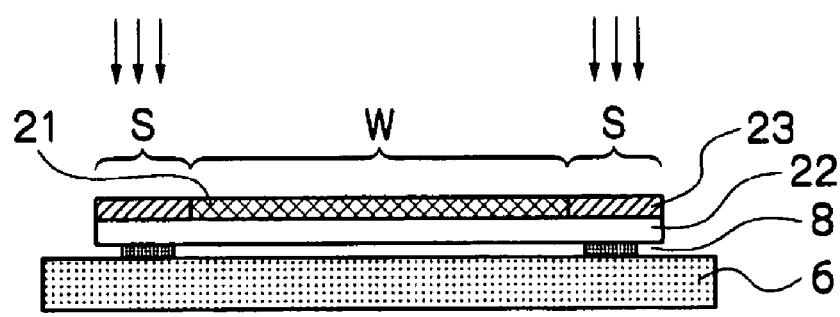
FIG. 6B is a cross-sectional view of the organic electroluminescence device in FIG. 6A.

FIG. 6A is a plan view showing still another embodiment of the organic electroluminescence device of the invention, and FIG. 6B is a cross-sectional view of the organic electroluminescence device in FIG. 6A.

The organic electroluminescence device shown in FIGS. 6A and 6B is an exemplary embodiment which is similar to that in FIG. 3 except for the configuration of the first flexible plate. That is, the first flexible plate is composed of a polymer film having a gas barrier film (second polymer film), formed by using two kinds of gas barrier materials (21 and 23) different in ultraviolet transmittance wherein the ultraviolet transmittance of the gas barrier material used in the S region is higher than the ultraviolet transmittance of the gas barrier film material used in forming the W region.

Examples of the material used for forming the gas barrier film include those referred as the material of the gas barrier film of the third polymer film shown in FIG. 3. Preferable combinations of the material of high ultraviolet transmittance (S region material) and the material of low ultraviolet transmittance (W region material) include a combination of $SiO_x$ and SiON, a combination of $SiO_x$ and SiN, and a combination of $Al_2O_3$ and SiN, and more preferable examples thereof include a combination of SiON and SiN.

From the viewpoint of light transmittance and prevention of the invasion by gas, water etc., the thickness of the gas barrier film is preferably in a range of 10 nm to 10 µm, and is more preferably in a range of 1 µm to 5 µm.

Examples of the material of the polymer film in the second polymer film can be similar ones of those used in the third polymer film, and preferable examples thereof are also similar to those used in the third polymer film.

The range of the thickness of the polymer film in the second polymer film is similar to that of the thickness of the polymer film of the third polymer film, and its preferable range is also similar to that of the polymer film of in the third polymer film.

In the gas barrier film on the polymer film shown in FIG. 6B, a material having low ultraviolet transmittance is used to form the W region (region through which a smaller quantity of UV light is transmitted) on the polymer film 22 of the first flexible plate 1 at the side opposite to the second flexible plate, and then a material having high ultraviolet transmittance is used to form the S region (region through which a larger quantity of UV light is transmitted), whereby a polymer film (second polymer film) can be obtained, which corresponds to the polymer film 2 and is formed by using two kinds of gas barrier film materials.

The order of formation of the two kinds of gas barrier layers is not particularly limited.

The gas barrier film of the second polymer film can be formed in a similar manner as that used in formation of the gas barrier film of the second polymer film shown in FIG. 3.

Figure 7A:
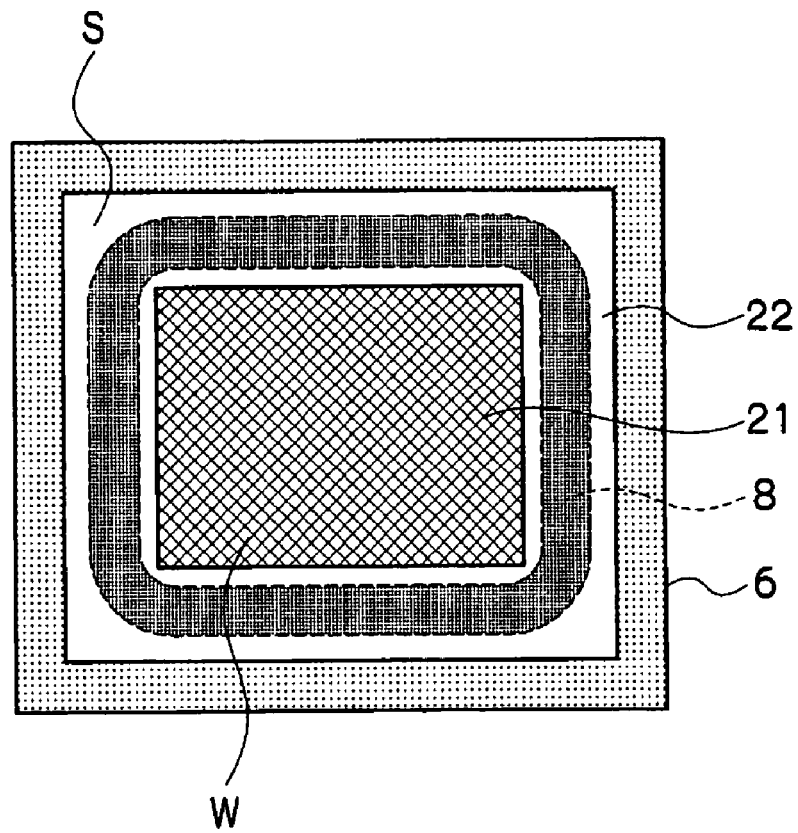
FIG. 7A is a plan view showing still another embodiment of the organic electroluminescence device of the invention.
Figure 7B:
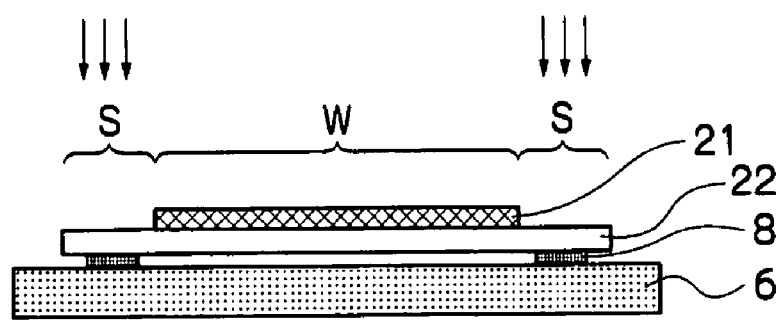
FIG. 7B is a cross-sectional view of the organic electroluminescence device in FIG. 7A.

FIG. 7A is a plan view showing still another embodiment of the organic electroluminescence device of the invention, and FIG. 7B is a cross-sectional view of the organic electroluminescence device in FIG. 7A.

The organic electroluminescence device shown in FIG. 7B is in the same exemplary embodiment as shown in FIG. 6 except for the configuration of the first flexible plate. That is, in the first flexible plate shown in FIG. 7B, the thickness of the portion corresponding to the S region of the gas barrier film possessed by the second polymer film 2 is made equal to or less than the thickness of the portion corresponding to the W region.

By constituting the organic electroluminescence device in this way, the quantity of UV light transmitted through the S region can be made larger than the quantity of UV light transmitted through the W region. As a result, since UV light does not reach an organic electroluminescence element which exists inside the first and second flexible plates, and which when viewed from the side of the first flexible plate is positioned at the backside thereof, and therefore, the element can be prevented from being deteriorated.

Examples of the material of the gas barrier film in the second polymer film is similar to those used in the second polymer film shown in FIG. 3, and preferable examples thereof are also similar to those used in the second polymer film shown in FIG. 3.

With regard to the thickness of the gas barrier film in the second polymer film, the thickness of the S region is equal to or less than the thickness of the W region, and preferably there is no gas barrier film in the S region.

Examples of the material of the polymer film in the second polymer film is similar to those used in the second polymer film show in FIG. 3, and preferable examples thereof are also similar to those used in the second polymer film shown in FIG. 3.

The first flexible plate can be formed in a manner similar to that for forming the S and W regions in FIG. 6.

FIGS. 8A to 12A are plan views showing still other exemplary embodiments of the organic electroluminescence device of the invention, and FIGS. 8B to 12B are cross-sectional views of the organic electroluminescence devices in FIGS. 8A to 12A, respectively.

The exemplary embodiments shown in FIGS. 8 to 12 have the configurations similar to those of the exemplary embodiments shown in FIGS. 3 to 7 except that the first flexible plate in the organic electroluminescence device of the invention shown in each of FIGS. 3 to 7 is used as a sealing plate, while the first flexible plate in the organic electroluminescence device of the invention shown in each of FIGS. 8 to 12 is used as a substrate.

Figure 8A:
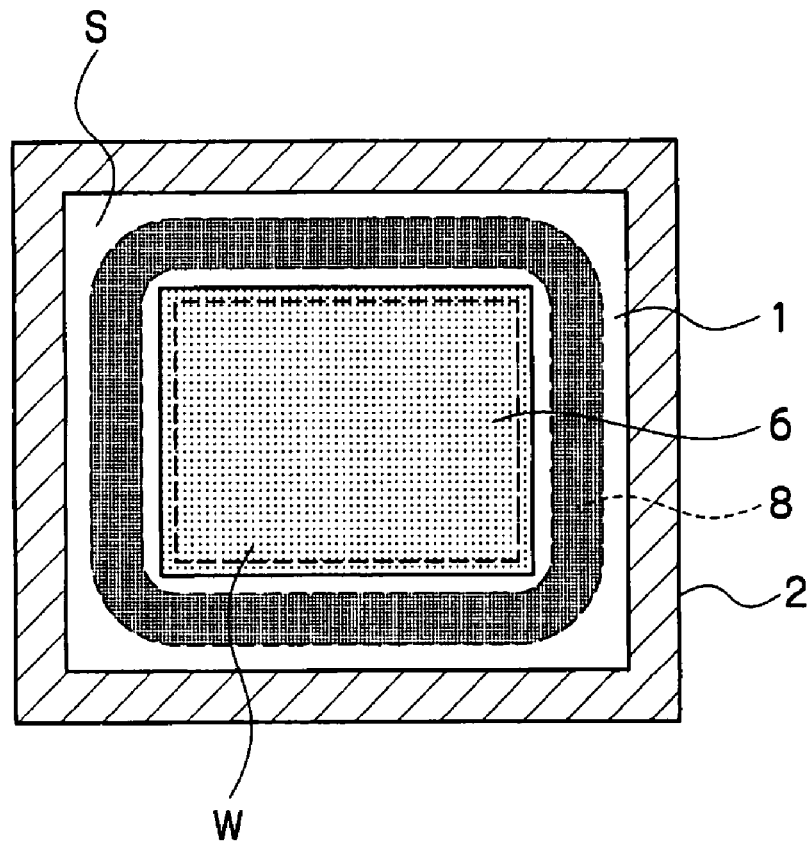
FIG. 8A is a plan view showing still another embodiment of the organic electroluminescence device of the invention.
Figure 8B:
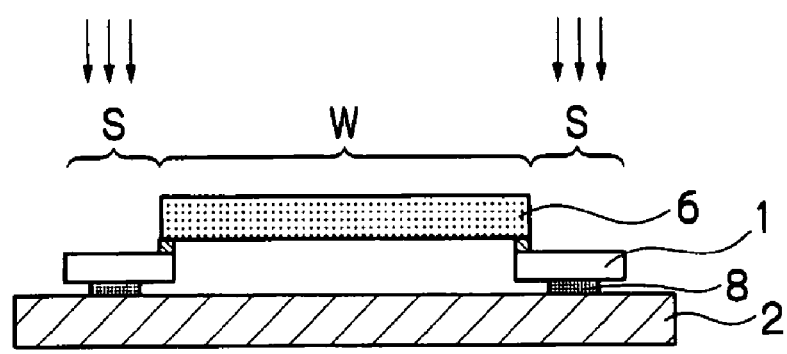
FIG. 8B is a cross-sectional view of the organic electroluminescence device in FIG. 8A.
Figure 9A:
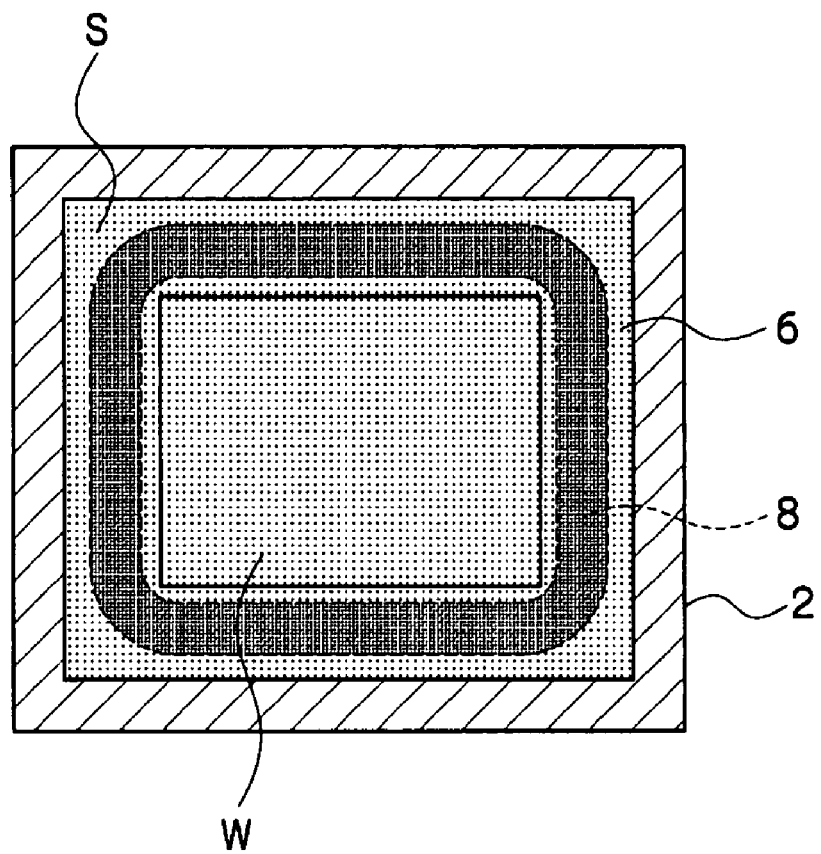
FIG. 9A is a plan view showing still another embodiment of the organic electroluminescence device of the invention.
Figure 9B:
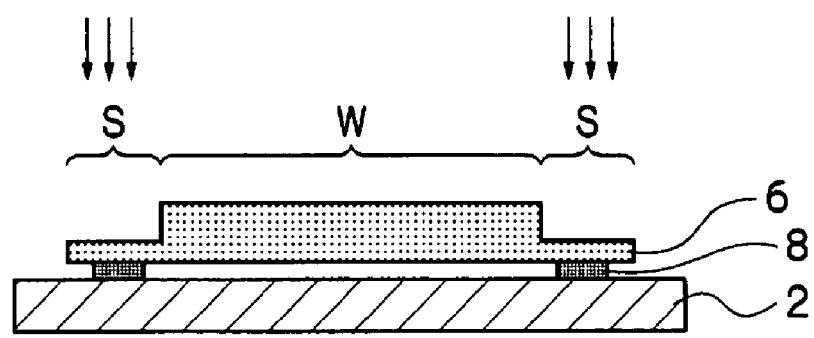
FIG. 9B is a cross-sectional view of the organic electroluminescence device in FIG. 9A.
Figure 10A:
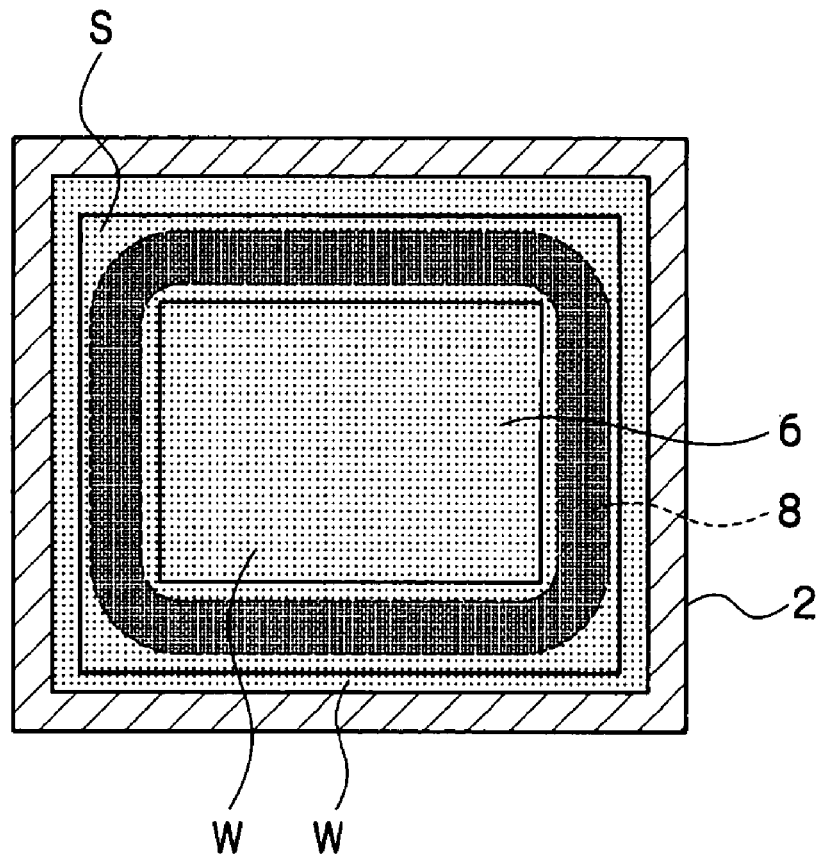
FIG. 10A is a plan view showing still another embodiment of the organic electroluminescence device of the invention.
Figure 10B:
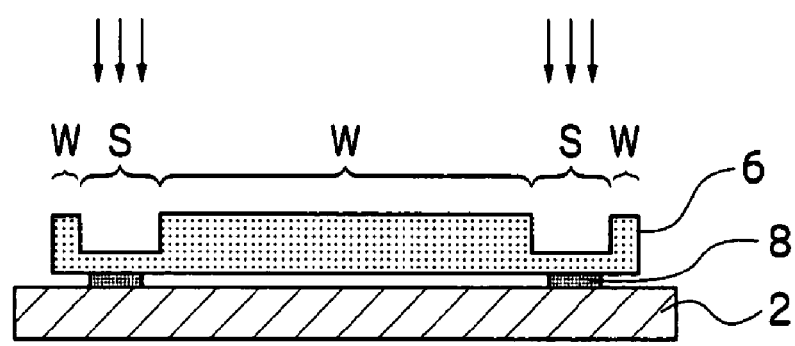
FIG. 10B is a cross-sectional view of the organic electroluminescence device in FIG. 10A.
Figure 11A:
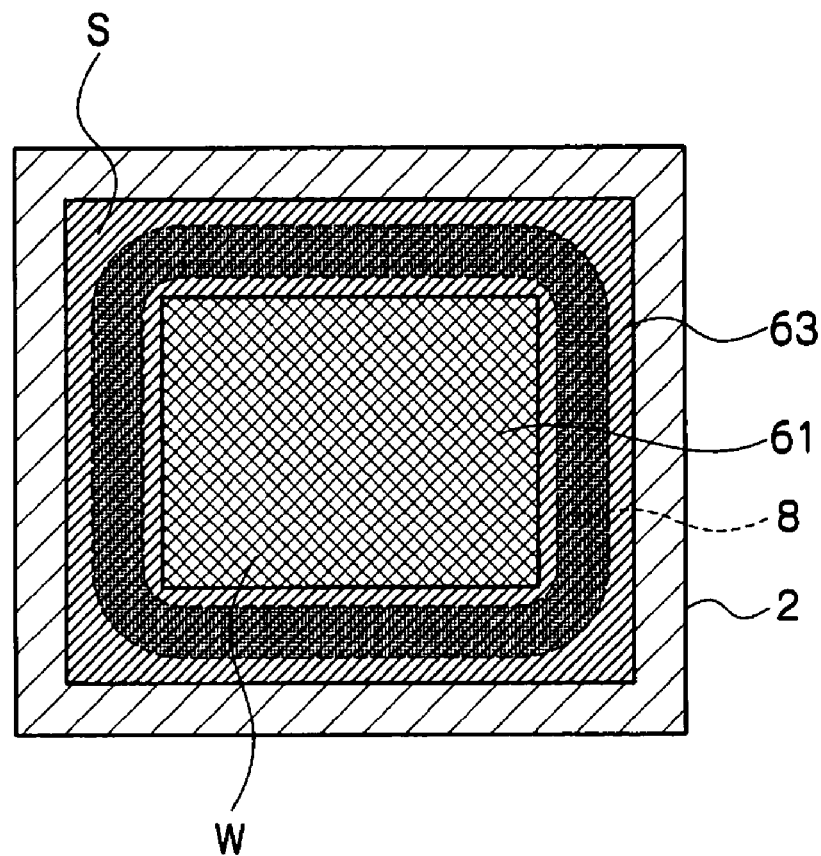
FIG. 11A is a plan view showing still another embodiment of the organic electroluminescence device of the invention.
Figure 11B:
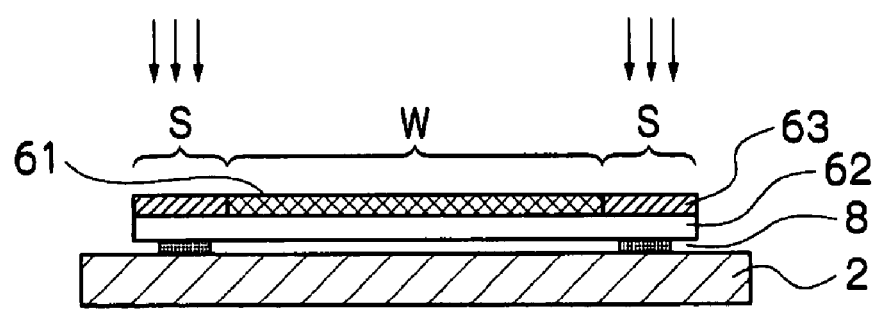
FIG. 11B is a cross-sectional view of the organic electroluminescence device in FIG. 11A.
Figure 12A:
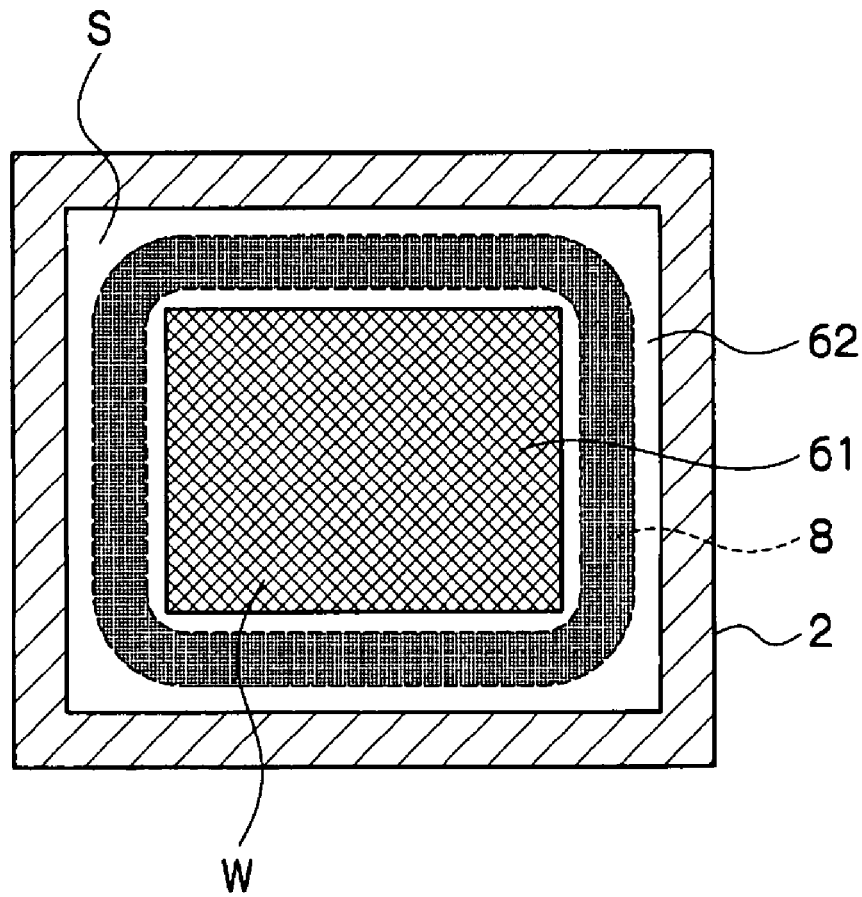
FIG. 12A is a plan view showing still another embodiment of the organic electroluminescence device of the invention.
Figure 12B:
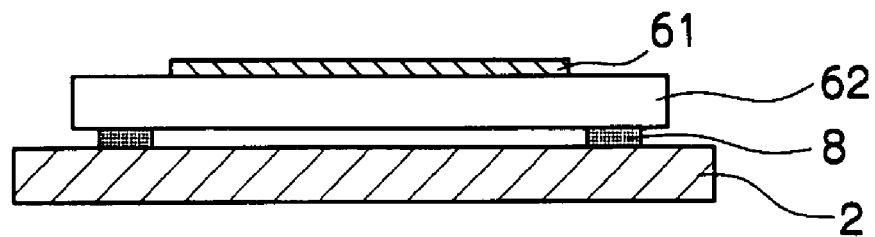
FIG. 12B is a cross-sectional view of the organic electroluminescence device in FIG. 12A.

Specifically, conditions such as the forming method, the thickness and the like of the organic electroluminescence device shown in FIG. 8B are similar to those of the device shown in FIG. 3B except that in the first flexible plate shown in FIG. 8B, the first polymer film 1 and the third polymer film (provided with a gas barrier film) 6 are used in place of the first polymer film 1 and the second polymer film (provided with a gas barrier film) 2 shown in FIG. 3B, and in the second flexible plate shown in FIG. 8B, the second polymer film (provided with a gas barrier film) 2 is used in place of the third polymer film (provided with a gas barrier film) 6 shown in FIG. 3B.

The embodiments shown in FIGS. 9 to 12 are also similar to those in the corresponding FIGS. 4 to 7, respectively. The gas barrier film materials 61 and 63 and the polymer film 62 in FIGS. 11 and 12 respectively correspond to the gas barrier film materials 21 and 23 and the polymer film 22 in FIGS. 7 and 8.

Figure 13A:
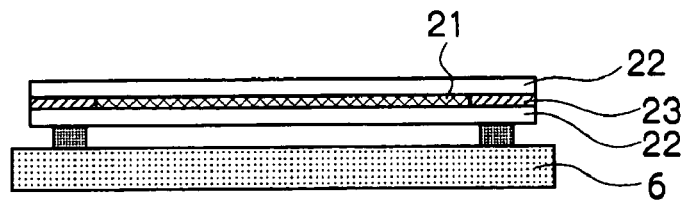
FIGS. 13A and 13B are cross-sectional views showing still other exemplary embodiments of the organic electroluminescence device of the invention.
Figure 13B:
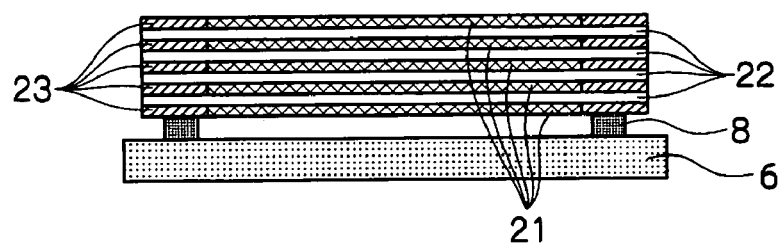

FIGS. 13A and 13B are cross-sectional views showing still other exemplary embodiments of the organic electroluminescence device of the invention.

FIG. 13A shows an exemplary embodiment which is similar to that shown in FIG. 6A except that a polymer film is further laminated in the outer side of the gas barrier film of the first flexible plate.

Examples of the material of the polymer film are similar to those used in the polymer film of the third polymer film shown in FIG. 3B, and preferable examples thereof are also similar to those used in the polymer film of the third polymer film shown in FIG. 3B.

FIG. 13B shows an exemplary embodiment which is similar to the organic electroluminescence device shown in FIG. 6 except that a plurality of the first flexible plates are laminated in the device, and that the gas barrier film is present on the first flexible plate at the side of the second flexible plate.

Even when the organic electroluminescence device of the invention is the laminate-type device shown in FIGS. 13A and 13B, the organic electroluminescence device can be made to have excellent sealing properties and exerting less influence on luminescence characteristics.

The laminate-type organic electroluminescence device can also be formed in the same manner as in the method described above.

Figure 14:
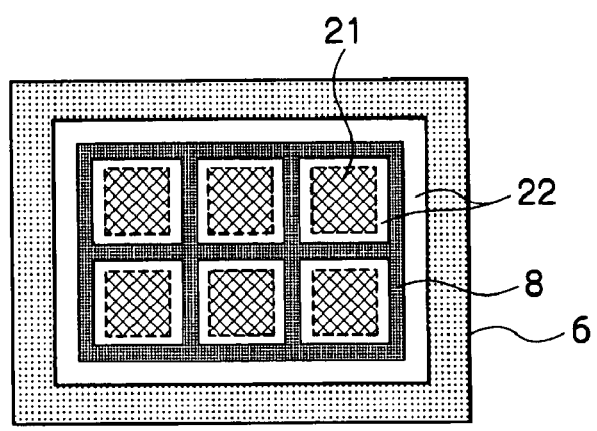
FIG. 14 is a plan view showing still another embodiment of the organic electroluminescence device of the invention in which a UV-curable resin is provided in a form containing plural frames.

FIG. 14 is a plan view showing still another embodiment of the organic electroluminescence device of the invention.

The organic electroluminescence device of the invention can be also preferably in exemplary embodiments similar to those shown in FIGS. 1 to 13 except that the UV-curable resin is provided in a form containing plural frames.

Figure 15A:
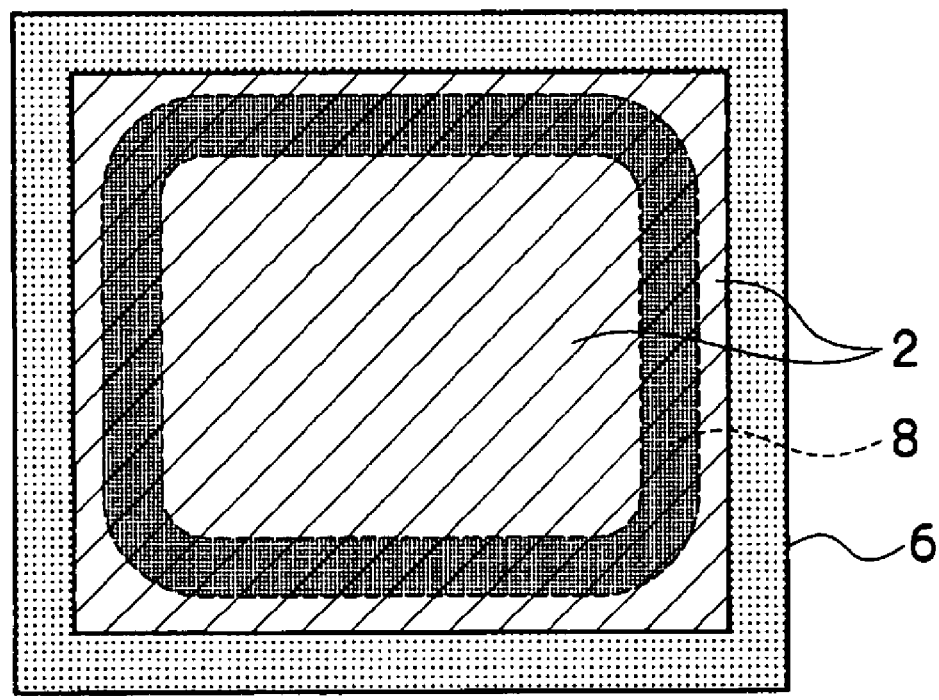
FIG. 15A is a plan view of one conventional organic electroluminescence device in which the quantity of UV light transmitted through a first flexible plate (sealing plate) is constant over the whole area.
Figure 15B:
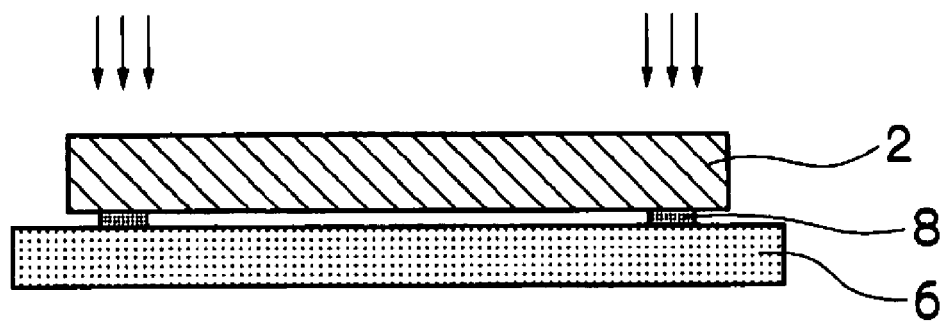
FIG. 15B is a cross-sectional view of the one conventional organic electroluminescence device.

FIGS. 15A and 15B are showing a conventional organic electroluminescence device wherein the quantity of UV light transmitted through the first flexible plate (sealing plate) is constant over the whole area.

The organic electroluminescence device is configured to have a first flexible plate, a second flexible plate and an UV-curable resin layer 8 therebetween.

The first flexible plate at the side irradiated with UV light for curing a UV-curable resin layer 8 is composed of a second polymer film 2 having a gas barrier film on the whole area, and the second flexible plate is composed of a third polymer film 6 provided with a gas barrier film. The first flexible plate at the side irradiated with UV light is configured such that the quantity of UV light transmitted is constant across all the regions. Accordingly, when the inside of the UV-curable resin layer 8 is irradiated with UV light, the quantity of UV light transmitted through the second polymer film having a gas barrier film is constant in any region, thus necessitating irradiation with UV light of higher intensity, which results in deterioration of the organic electroluminescence element.

Figure 16A:
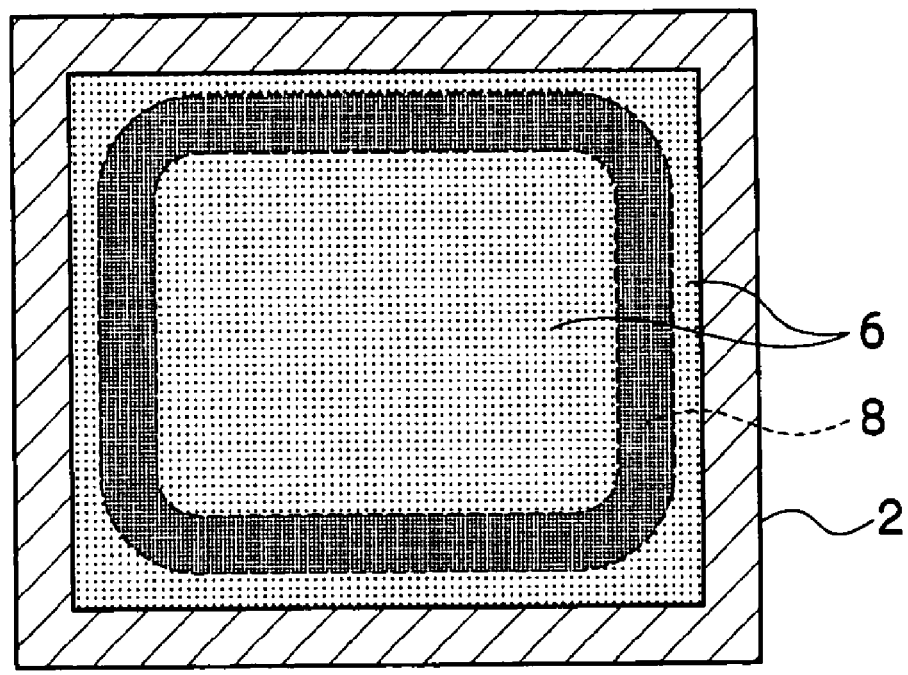
FIG. 16A is a plan view of another conventional organic electroluminescence device in which the quantity of UV light transmitted through a first flexible plate (substrate) is constant over the whole area.
Figure 16B:
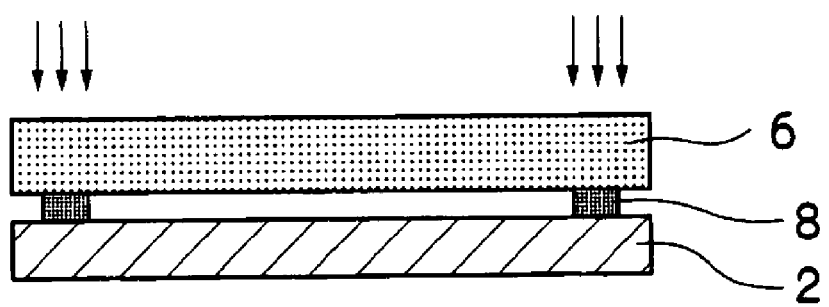
FIG. 16B is a cross-sectional view of the another conventional organic electroluminescence device.

FIGS. 16A and 16B are showing still another exemplary embodiment of a conventional organic electroluminescence device wherein the quantity of UV light transmitted through a first flexible plate (substrate) is constant over the whole area.

The organic electroluminescence device shown in FIGS. 15A and 15B is similar to that shown in FIGS. 16A and 16B except that while the first flexible plate in the organic electroluminescence device in FIGS. 15A and 15B is used as a sealing plate, the first flexible plate in the organic electroluminescence device in FIGS. 16A and 16B is used as a substrate. The operational effects of the device in FIGS. 15A and 15B are also similar to those in FIGS. 16A and 16B.

EXAMPLES

Hereinafter, the present invention is described in more detail by reference to the Examples, while the scope of the invention is not limited thereto.

Example 1

Formation of First Flexible Plate

As shown in FIG. 1, a film formed of polyethylene terephthalate (PET; first polymer film 1; thickness: 100 μm) provided with a frame-shaped adhesive (an epoxy adhesive; trade name: XNR5516HV, manufactured by Nagase ChemteX Corporation; corresponding to UV-curable adhesive 4) was aligned with a film formed of polyethylene naphthalate provided with a SiON gas barrier film (PEN; a second polymer film 2; gas barrier film thickness: 100 nm), and then the resultant aligned films were bonded by being irradiated with UV light (365 nm, 900 seconds) from the side on which the PET film is provided to form a first flexible plate.

This lamination was carried out such that the area within the frame on the PET film was covered with the PEN film and a portion of the PET film projected from the periphery of the PEN film.

Formation of Second Flexible Plate

Separately, an organic electroluminescence element was formed on a PEN film (third polymer film 6; overall thickness: 100 μm), which has a 100 nm thickness of a gas barrier film formed thereon of SiON, in the following manner.

A UV-curable resin adhesive (an epoxy-based adhesive, trade name: XNR5516HV, manufactured by Nagase ChemteX Corporation) was applied by discharging liquid droplets, with a dispenser, onto a portion which is at the periphery of the organic electroluminescence element and within the S region of the first flexible plate, to form a frame-shaped UV-curable resin layer 8 to give a second flexible plate.

In formation of the organic electroluminescence element, ITO was applied by sputtering, and constituents of the organic electroluminescence element other than ITO were applied by vacuum deposition. A luminescence material Ir(ppy)$_3$, a host material CBP, a hole-injection layer 2-TNATA, a hole-transport material α-NPD, a hole block material BAlq, and an electron-transport material Alq$_3$ were used respectively, so that the element was configured by providing the following layers in the following order: ITO (thickness: 150 nm)/2-TNATA (thickness: 140 nm)/α-NPD (thickness: 50 nm)/10% Ir(ppy)$_3$+CBP (thickness: 20 nm)/BAlq (thickness: 10 nm)/Alq$_3$ (thickness: 20 nm)/LiF (thickness: 0.5 nm)/Al (thickness: 100 nm), in which the ITO was positioned as the anode and the Al was positioned as the cathode.

Adhesion Between First Flexible Plate and Second Flexible Plate

The S region of the first flexible plate and the frame-shaped UV-curable resin layer of the second flexible plate were faced to each other and pressure-bonded, and then, as shown in stage (7) in FIG. 1, the resultant was irradiated with UV light from the side on which the S region was provided so that the S region is used as an irradiation face so as to cure the UV-curable resin layer to bind the first flexible plate with the adhesive to the second flexible plate.

By the process described above, one example of the organic electroluminescence device of the invention (organic electroluminescence device of Example 1) was produced.

Under conditions of a temperature of 25° C., relative humidity of 25% and current density of 15 mA/cm$^2$, the organic electroluminescence device was driven to emit light for 200 hours, and then the ratio (residual ratio) of the area of the light-emitting portions of the luminescence element relative to the entire area of the luminescence element was determined for evaluation. The residual ratio was 92%.

Comparative Example 1

Formation of First Flexible Plate

A comparative organic electroluminescence device was produced in the same manner as in Example 1 except that a first flexible plate having PEN (second polymer film 2, total thickness 100 μm) provided with a barrier film (SiON) having a thickness of 100 nm as shown in FIG. 15 was used in place of the first flexible plate used in Example 1.

When the organic electroluminescence device was evaluated in the same manner as in Example 1, the ratio of the area of the light-emitting portions of the luminescence element relative to the entire area of the luminescence element after emission of light for 200 hours was 43%.

What is claimed is:

1. A method for manufacturing an organic electroluminescence device comprising a first flexible plate and a second flexible plate and an organic electroluminescence element provided on a portion at approximately the center of at least one of the flexible plates, the method comprising:
    (A) forming the first flexible plate;
    (B) forming a substantially frame-shaped UV-curable resin layer on at least one of the first flexible plate and the second flexible plate; and
    (C) adhering the first flexible plate with the second flexible plate,
    wherein the step (A) of forming the first flexible plate comprises adhering a first polymer film, which is able to transmit ultraviolet light and is substantially flat frame-shaped, and a second polymer film having a flat shape, which has a gas barrier film formed thereon, so that the first polymer film and the second polymer film face each other such that the second polymer film covers substantially all of the area of the inside of the frame of the first polymer film, and at least a part of the first polymer film is left protruding from an outer periphery of the second polymer film, so as to form the first flexible plate,
    the first flexible plate has a S region and a W region which are different from each other in the quantity of UV light transmitted per unit area therethrough,
    the at least a part of the first polymer film left protruding from the outer periphery of the second polymer film corresponds to the S region,
    the W region is present in a portion approximately at the center of the first flexible plate,
    the S region is present at a periphery of the W region, and the quantity of UV light transmitted through the S region is larger per unit area than the quantity of UV light transmitted through the W region;
    wherein, in the step (B) of forming the substantially frame-shaped UV-curable resin layer on at least one of the first flexible plate and the second flexible plate, when the first flexible plate and the second flexible plate have been overlapped with each other, the UV-curable resin layer is positioned at a periphery of the organic electroluminescence element and overlaps at least partially with the S region; and
    wherein in the step (C) of adhering the first flexible plate with the second flexible plate, after the S region and the frame-shaped UV-curable resin layer are faced to each other so as to be overlapped, the resultant is irradiated with UV light which uses the S region as an irradiation face, so as to cure the UV-curable resin layer.

2. The method for manufacturing an organic electroluminescence device of claim 1, wherein the gas barrier film does not reside in the S region or the thickness of the gas barrier film in the S region is less than the thickness of the gas barrier film in the W region.

3. The method for manufacturing an organic electroluminescence device of claim 2, wherein the gas barrier film material comprises at least SiN, SiON, SiOx, MgO, $Al_2O_3$, or an organic resin, in which x represents the content ratio of the number of oxygen atoms relative to the number of silicon atoms and is larger than 0.

4. An organic electroluminescence device produced by the manufacturing method of claim 3.

5. An organic electroluminescence device produced by the manufacturing method of claim 2.

6. The method for manufacturing an organic electroluminescence device of claim 1, further comprising forming the S and W regions so that the thickness of the S region is less than the thickness of the W region so as to differentiate the S and W regions in the quantity of UV light transmitted per unit area therethrough.

7. An organic electroluminescence device produced by the manufacturing method of claim 6.

8. The method for manufacturing an organic electroluminescence device of claim 1, wherein a material used for forming the gas barrier film in the S region has a higher UV transmittance than that of a material used for forming the gas barrier film used in the W region.

9. The method for manufacturing an organic electroluminescence device of claim 8, wherein the gas barrier film material comprises at least SiN, SiON, SiOx, MgO, $Al_2O_3$, or an organic resin, in which x represents the content ratio of the number of oxygen atoms relative to the number of silicon atoms and is larger than 0.

10. An organic electroluminescence device produced by the manufacturing method of claim 9.

11. An organic electroluminescence device produced by the manufacturing method of claim 8.

12. The method for manufacturing an organic electroluminescence device of claim 1, wherein the gas barrier film material comprises at least SiN, SiON, SiOx, MgO, $Al_2O_3$, or an organic resin, in which x represents the content ratio of the number of oxygen atoms relative to the number of silicon atoms and is larger than 0.

13. An organic electroluminescence device produced by the manufacturing method of claim 12.

14. An organic electroluminescence device produced by the manufacturing method of claim 1.

15. An organic electroluminescence device produced by the manufacturing method of claim 1, wherein the first polymer film material is selected from the group consisting of polyethylene terephthalate, polymarbonate, polypropylene, polyolefin, polycarbonate, polyethylene naphthalate and polyether sulfone.

* * * * *